US012069828B2

(12) United States Patent
Park et al.

(10) Patent No.: US 12,069,828 B2
(45) Date of Patent: Aug. 20, 2024

(54) WINDOW, METHOD OF FABRICATING THE SAME, AND DISPLAY DEVICE INCLUDING THE SAME

(71) Applicant: Samsung Display Co., Ltd., Yongin-Si (KR)

(72) Inventors: Junsu Park, Seoul (KR); Hyun-Ju Lee, Asan-si (KR); Gisuk Kwon, Cheonan-si (KR); Younggil Park, Asan-si (KR); Nari Ahn, Seongnam-si (KR); Sooim Jeong, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 544 days.

(21) Appl. No.: 16/890,069

(22) Filed: Jun. 2, 2020

(65) Prior Publication Data

US 2021/0059064 A1 Feb. 25, 2021

(30) Foreign Application Priority Data

Aug. 21, 2019 (KR) ........................ 10-2019-0102281

(51) Int. Cl.
*H05K 5/03* (2006.01)
*B05D 3/06* (2006.01)
(Continued)

(52) U.S. Cl.
CPC ............... *H05K 5/03* (2013.01); *B05D 3/067* (2013.01); *B05D 7/04* (2013.01); *B05D 7/54* (2013.01);
(Continued)

(58) Field of Classification Search
CPC .. G02B 1/14; G02B 1/16; G02B 1/111; G02B 1/115; G02B 1/116; G02B 5/285;
(Continued)

(56) References Cited

U.S. PATENT DOCUMENTS 6,329,041 B1 12/2001 Tsuchiya et al.
6,887,557 B2 * 5/2005 Onozawa ................ G02B 1/14 427/508

(Continued)

FOREIGN PATENT DOCUMENTS

CN 1400095 A 3/2003
CN 104945965 A 9/2015

(Continued)

*Primary Examiner* — Jie Lei
(74) *Attorney, Agent, or Firm* — CANTOR COLBURN LLP

(57) ABSTRACT

A window includes a base layer and a hard coating layer on the base layer. The hard coating layer includes a first layer on the base layer and of a first thickness, and a second layer on the first layer and of a second thickness. The second layer includes an antistatic agent. The hard coating layer has a hardness reduction rate of 50 percent (%) or less expressed as follows.

$$H = \left(1 - \frac{D_1}{D_2}\right) \times 100$$

In the equation above, H is a hardness reduction rate (%) of a target layer, $D_1$ is a hardness reduction rate measured from the target layer at a temperature of 60 degrees Celsius (° C.) with a relative humidity of 93%, and $D_2$ is a hardness reduction rate measured from the target layer at a room temperature with a relative humidity of 30%.

20 Claims, 7 Drawing Sheets

DD
WM
TS
PZ
DP
PM
DM
DR3
DR2

(51) Int. Cl.

| | |
|---|---|
| ***B05D 7/00*** | (2006.01) |
| ***B05D 7/04*** | (2006.01) |
| ***C03C 17/42*** | (2006.01) |
| ***G02B 1/14*** | (2015.01) |
| ***G02B 1/16*** | (2015.01) |
| ***H05K 5/00*** | (2006.01) |

(52) U.S. Cl.
CPC ................ *C03C 17/42* (2013.01); *G02B 1/14* (2015.01); *G02B 1/16* (2015.01); *H05K 5/0017* (2013.01); *C03C 2217/78* (2013.01)

(58) Field of Classification Search
CPC .... B32B 3/00; B32B 3/30; B32B 7/02; B32B 7/12; B32B 27/08; B32B 27/16; H05K 5/00; H05K 5/03; H05K 5/0017; B05D 3/06; B05D 3/067; B05D 7/04; B05D 7/54; B05D 7/00; C03C 17/42; C03C 2217/78
USPC ......... 359/580–582, 585; 428/213, 206, 208, 428/157, 195.1, 327, 328, 335
See application file for complete search history.

(56) References Cited

U.S. PATENT DOCUMENTS

| | | | |
|---|---|---|---|
| 10,908,746 B2 | 2/2021 | Seo et al. | |
| 11,235,554 B2 | 2/2022 | Park et al. | |
| 2015/0268697 A1* | 9/2015 | Nam .................... | G06F 1/1643 428/157 |
| 2018/0327634 A1 | 11/2018 | Heo et al. | |
| 2018/0356859 A1 | 12/2018 | Hamburgen et al. | |
| 2019/0064950 A1 | 2/2019 | Hsu | |
| 2019/0067601 A1 | 2/2019 | Ji et al. | |
| 2019/0068764 A1 | 2/2019 | Liu et al. | |
| 2019/0073002 A1 | 3/2019 | Wu et al. | |
| 2019/0073035 A1 | 3/2019 | Modarres et al. | |
| 2019/0074456 A1 | 3/2019 | Macinnis et al. | |

FOREIGN PATENT DOCUMENTS

| | | |
|---|---|---|
| CN | 109755277 A | 5/2019 |
| CN | 109801561 A | 5/2019 |
| KR | 101168073 B1 | 7/2012 |
| KR | 20150111828 A | 10/2015 |
| KR | 101620998 B1 | 5/2016 |
| KR | 1020170031154 A | 3/2017 |
| KR | 1020180098036 A | 9/2018 |
| KR | 1020180125116 A | 11/2018 |
| KR | 20190094841 A | 8/2019 |
| TW | 574106 B | 2/2004 |

* cited by examiner

FIG. 12A
AC
BS
FIG. 12B
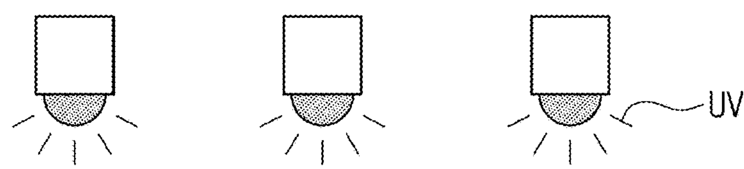
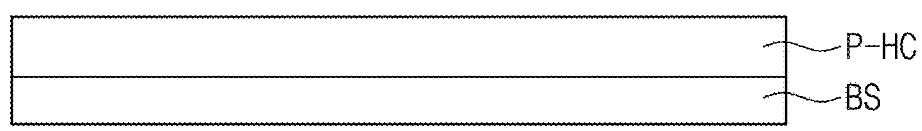
FIG. 12C
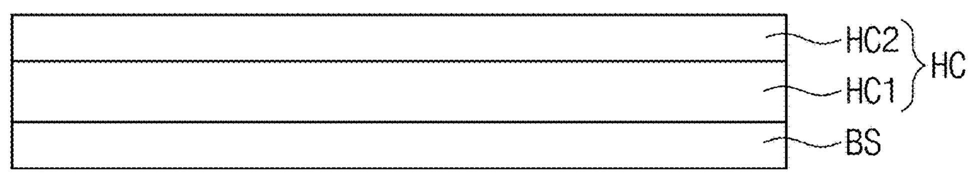

WINDOW, METHOD OF FABRICATING THE SAME, AND DISPLAY DEVICE INCLUDING THE SAME

This application claims priority to Korean Patent Application No. 10-2019-0102281, filed on Aug. 21, 2019, and all the benefits accruing therefrom under 35 U.S.C. § 119, the content of which in its entirety is herein incorporated by reference.

BACKGROUND

1. Field

Exemplary embodiments of the invention relate to a window, a method of fabricating the same, and a display device including the same. More particularly, exemplary embodiments of the invention relate to a window used for a flexible display device.

2. Description of the Related Art

Display devices exhibit various images on their display screen to provide information to users. Bendable display devices are recently being developed. Unlike flat display devices, flexible display devices may be folded or rolled like a paper. The flexible display devices capable of being deformed in various shapes improve portability and users' convenience. The flexible display devices may be classified into rollable display devices, foldable display devices, stretchable display devices, and the like.

SUMMARY

Windows used in flexible display devices may be stressed due to repeated bending. Accordingly, there is a demand for developing windows that are durable despite such repeated bending under various environments for usage of display devices.

Some exemplary embodiments of the invention provide a window whose durability is increased under reliable environment.

Some exemplary embodiments of the invention provide a method of fabricating a window whose durability is increased under reliable environment.

Some exemplary embodiments of the invention provide a display device including a window whose durability is increased under reliable environment.

An exemplary embodiment of a window may include a base layer, and a hard coating layer on the base layer. The hard coating layer may include a first layer on the base layer, the first layer having a first thickness, and a second layer on the first layer, the second layer including an antistatic agent and having a second thickness. The hard coating layer may have a hardness reduction rate of 50 percent (%) or less expressed by Equation 1 below.

$$H=\left(1-\frac{D_1}{D_2}\right)\times 100 \quad \text{[Equation 1]}$$

In Equation 1 above, H may be a hardness reduction rate (%) of a target layer, $D_1$ may be a hardness measured from the target layer at a temperature of 60 degrees Celsius (° C.) with a relative humidity of 93%, and $D_2$ may be a hardness measured from the target layer at a room temperature with a relative humidity of 30%.

In an exemplary embodiment, the antistatic agent may include a Sb-based material.

In an exemplary embodiment, an atomic ratio of Sb in the second layer may be greater than an atomic ratio of Sb in the first layer.

In an exemplary embodiment, the first thickness may be ⅔ to 9 times the second thickness.

In an exemplary embodiment, the hardness ($D_1$) measured from the target layer at the temperature of 60° C. with the relative humidity of 93% may fall within a range of 0.10 gigapascal (GPa) to 0.22 GPa, and the hardness ($D_2$) measured from the target layer at the room temperature with the relative humidity of 30% may fall within a range of 0.28 GPa to 0.40 GPa.

In an exemplary embodiment, the hard coating layer may be in contact with the base layer.

In an exemplary embodiment, the hardness reduction rate (H) of the base layer may be 30% or less.

In an exemplary embodiment, the hard coating layer may further include the antistatic agent, a nanosilica sol, and a translucent resin.

In an exemplary embodiment, the window may fold with reference to a predetermined bending axis.

In an exemplary embodiment, the base layer may include a polymer film, a plastic substrate, or a glass.

In an exemplary embodiment, a thickness of the hard coating layer may be in a range between 5 micrometers (μm) and 20 μm.

An exemplary embodiment of a method of fabricating a window may include preparing a base layer, coating a hard-coating composition solution on the base layer, and curing the hard-coating composition solution to form a hard coating layer. The hard coating layer may have a hardness reduction rate of 50% or less expressed by Equation 1 below.

$$H=\left(1-\frac{D_1}{D_2}\right)\times 100 \quad \text{[Equation 1]}$$

In Equation 1 above, H may be a hardness reduction rate (%) of a target layer, $D_1$ may be a hardness measured from the target layer at a temperature of 60° C. with a relative humidity of 93%, and $D_2$ may be a hardness measured from the target layer at a room temperature with a relative humidity of 30%.

In an exemplary embodiment, the hard-coating composition solution may include an antistatic agent, a nanosilica sol, a translucent resin, a photoinitiator, and a solvent.

In an exemplary embodiment, the step of curing the hard-coating composition solution may include irradiating an ultraviolet ray into the hard-coating composition solution.

In an exemplary embodiment, the antistatic agent may be distributed to 10% to 60% of a thickness of the hard coating layer in a direction from a top surface of the hard coating layer toward a bottom surface of the hard coating layer.

In an exemplary embodiment, the base layer may include a polymer film, a plastic substrate, or a glass.

In an exemplary embodiment, a thickness of the hard coating layer may be in a range between 5 μm and 20 μm.

According to some exemplary embodiments of the invention, a display device may include a display module, and a window on the display module. The window may include a base layer, and a hard coating layer on the base layer. The hard coating layer may include a first layer on the base layer, the first layer having a first thickness, and a second layer on the first layer, the second layer including an antistatic agent and having a second thickness. The hard coating layer may have a hardness reduction rate of 50% or less expressed by Equation 1 below.

$$H = \left(1 - \frac{D_1}{D_2}\right) \times 100 \quad \text{[Equation 1]}$$

In Equation 1 above, H may be a hardness reduction rate (%) of a target layer, $D_1$ may be a hardness measured from the target layer at a temperature of 60° C. with a relative humidity of 93%, and $D_2$ may be a hardness measured from the target layer at a room temperature with a relative humidity of 30%.

In an exemplary embodiment, the antistatic agent may include a Sb-based material.

In an exemplary embodiment, the first thickness may be ⅔ to 9 times the second thickness.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which:

FIGS. 12A, 12B, and 12C illustrate cross-sectional view showing an exemplary embodiment of a method of fabricating a window.

DETAILED DESCRIPTION

Figure 1:
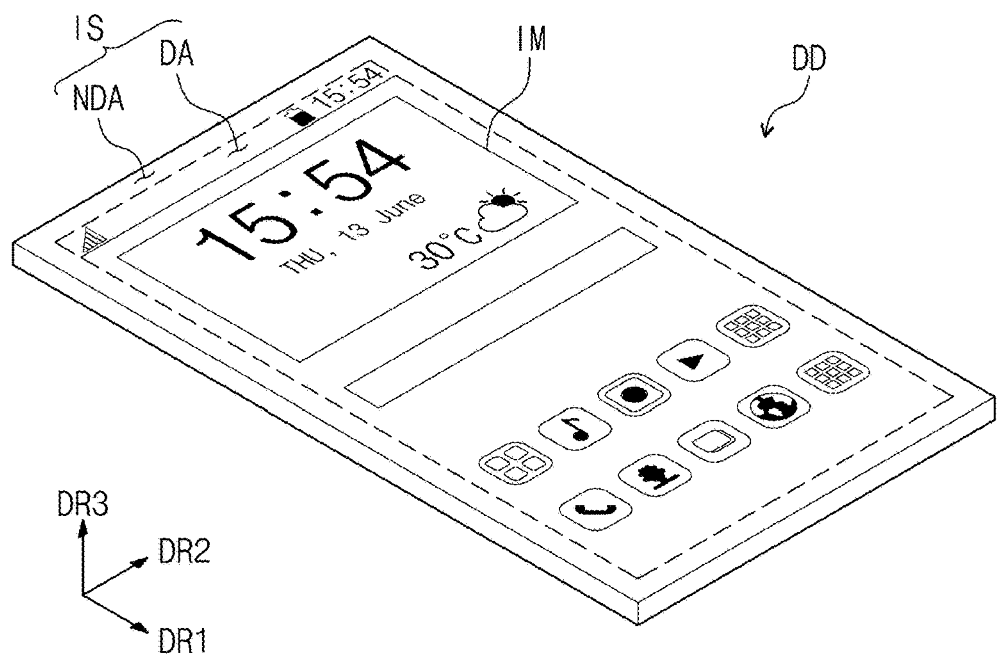
FIG. 1 illustrates a perspective view showing a display device.

The following will now describe some exemplary embodiments of the invention in conjunction with the accompanying drawings. In this description, when a certain component (or region, layer, portion, etc.) is referred to as being "on", "connected to", or "coupled to" other component(s), the certain component may be directly disposed on, directly connected to, or directly coupled to the other component(s) or at least one intervening component may be present therebetween.

Like numerals indicate like components. Moreover, in the drawings, thicknesses, ratios, and dimensions of components are exaggerated for effectively explaining the technical contents. The term "and/or" includes one or more combinations defined by associated components.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms used herein including technical and scientific terms have the same meaning generally understood by one of ordinary skilled in the art. Also, terms as defined in dictionaries generally used should be understood as having a meaning identical or meaning contextually defined in the art and should not be understood as ideally or excessively formal meaning unless definitely defined herein.

Herein, it will be discussed in detail preferable embodiments of the invention in conjunction with the accompanying drawings. The following will describe a window WM and a display device DD including the same according to some exemplary embodiments of the invention.

Referring to FIG. 1, an exemplary embodiment of the display device DD according to the invention includes a display surface IS on which an image IM is displayed. The display surface IS on which the image IM is displayed is parallel to a plane defined by a first direction DR1 and a second direction DR2. A third direction DR3 indicates a normal direction to the display surface IS or a thickness direction of the display device DD. A front surface (or top surface) and a rear surface (or bottom surface) of each of components are distinguished from each other in the third direction DR3. The first, second, and third directions DR1, DR2, and DR3 are relative concepts, and may thus be converted into other directions. The exemplary embodiment shows a flexible display device, but the invention is not limited thereto.

An exemplary embodiment of the display device DD according to the invention may be a foldable display device or rollable display device. An exemplary embodiment of the display device DD according to the invention may be applicable not only to large-sized electronic products such as television sets and monitors, but to small and medium-sized electronic products such as mobile phones, tablet personal computers ("PCs"), automotive navigation systems, game consoles, and smart watches.

An exemplary embodiment of a plurality of regions may be included in the display surface IS of the display device DD according to the invention. The display device DD may include a display area DA on which the image IM is displayed and a non-display area NDA adjacent to the display area DA. The non-display area NDA may be a region on which no image is displayed. FIG. 1 shows a clock window and application icons as examples of the image IM. The display area DA may have a tetragonal shape. The non-display area NDA may surround the display area DA. The invention, however, is not limited thereto, and the display and non-display areas DA and NDA may be relationally changed in shape.

Although not shown, the display device DD may include a housing. The housing may be disposed at an outer periphery of the display device DD and may accommodate therein internal parts of the display device DD.

Figure 2:
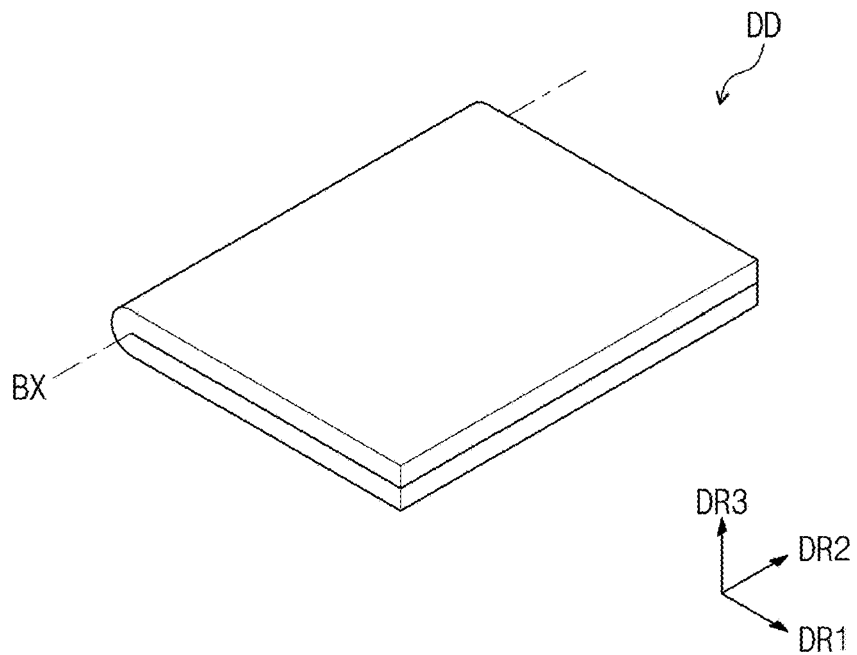
FIGS. 2 to 6 illustrate perspective views showing a display device in a folded or rolled state.

Referring to FIG. 2, an exemplary embodiment of the display device DD according to the invention may fold inwards (or in-fold) with reference to a bending axis BX. Because the display device DD folds inwards with reference to the bending axis BX, a rear surface opposite to the display device DD may be exposed externally, and the display surface IS of the display device DD may fold with reference to the bending axis BX such that both display surfaces IS divided with reference to the bending axis BX may fold to face each other.

Figure 3:
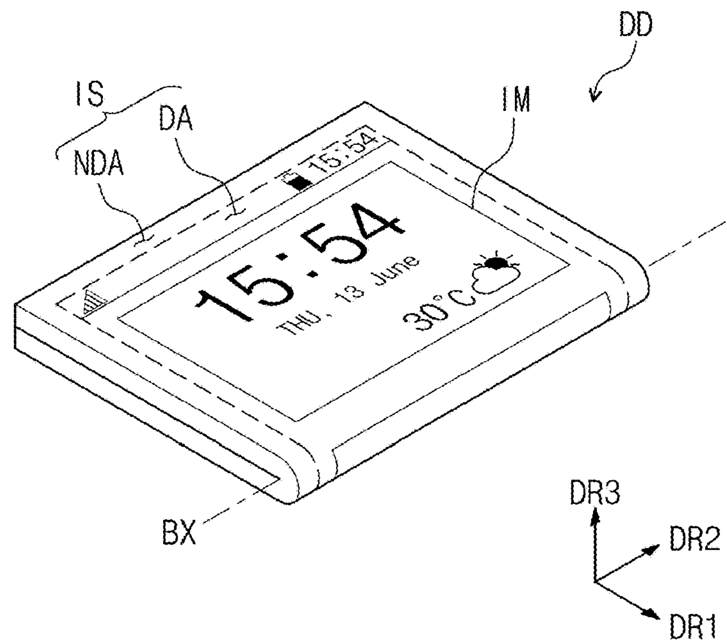

Referring to FIG. 3, an exemplary embodiment of the display device DD according to the invention may fold outwards (or out-fold) with reference to the bending axis BX. Because the display device DD folds outwards with reference to the bending axis BX, the display surface IS of the display device DD may be exposed externally, and the rear surface of the display device DD may fold with reference to the bending axis BX such that both rear surfaces divided with reference to the bending axis BX may fold to face each other.

Figure 4:
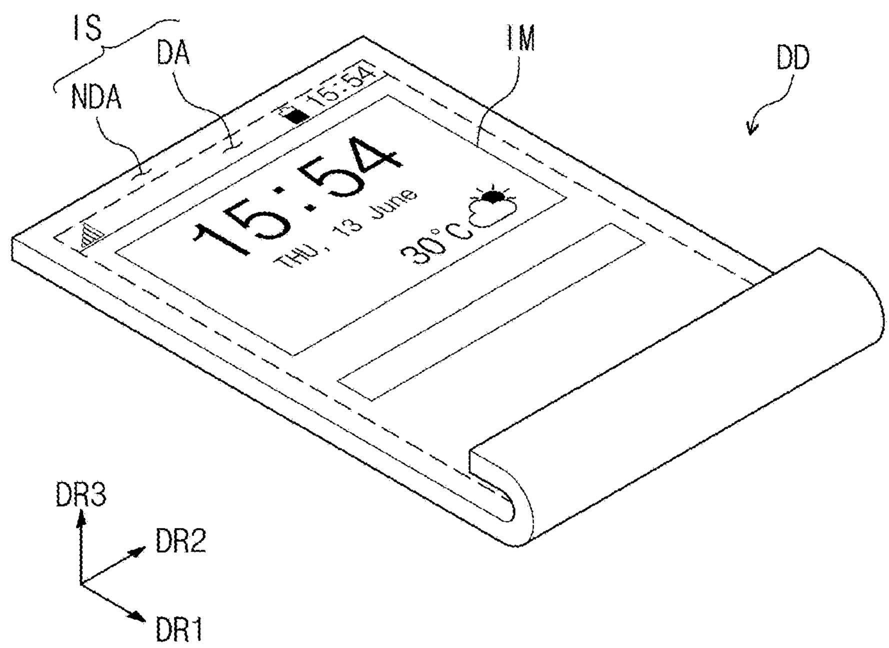
Figure 5:
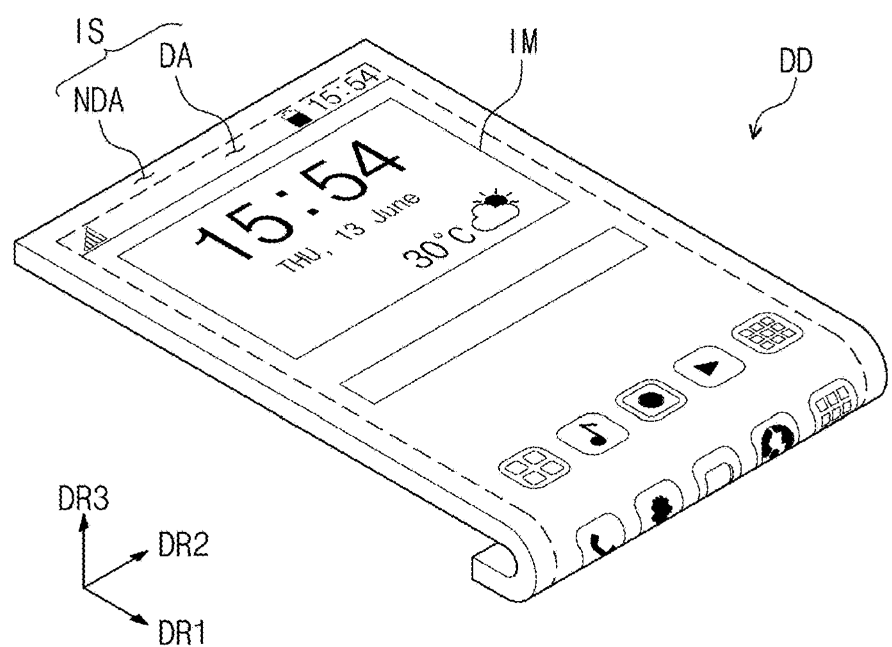
Figure 6:
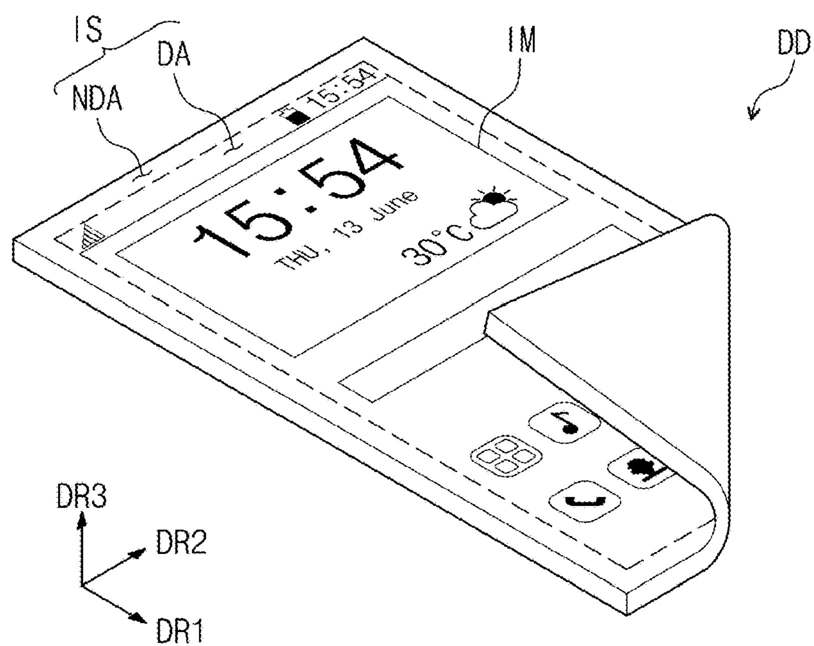

Referring to FIGS. 4 to 6, an exemplary embodiment of the display device DD according to the invention may fold or roll in various fashions. As shown in FIG. 4, the display device DD may roll or fold inwards from an end thereof. As shown in FIG. 5, the display device DD may roll or fold outwards from an end thereof. As shown in FIG. 6, the display device DD may fold or roll in a diagonal direction. FIGS. 4 to 6 exemplarily show the rolling or folding manners, and the folding or rolling of the display device DD may be variously changed without being limited to that mentioned above.

Figure 7:
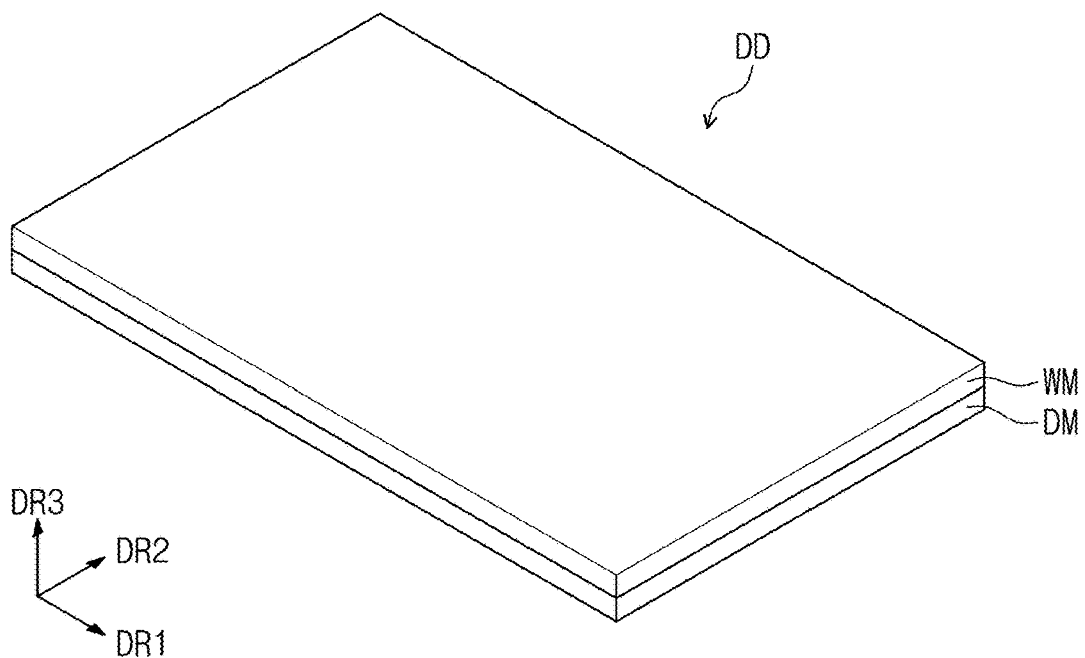
FIG. 7 illustrates a perspective view showing an exemplary embodiment of a display device.
Figure 8:
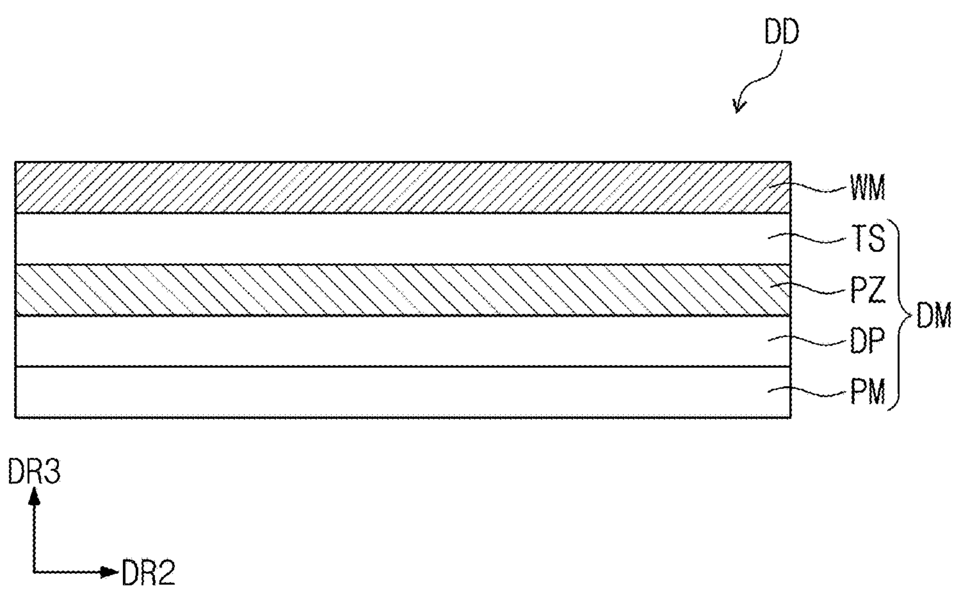
FIG. 8 illustrates a cross-sectional view showing an exemplary embodiment of a display device.
Figure 9:
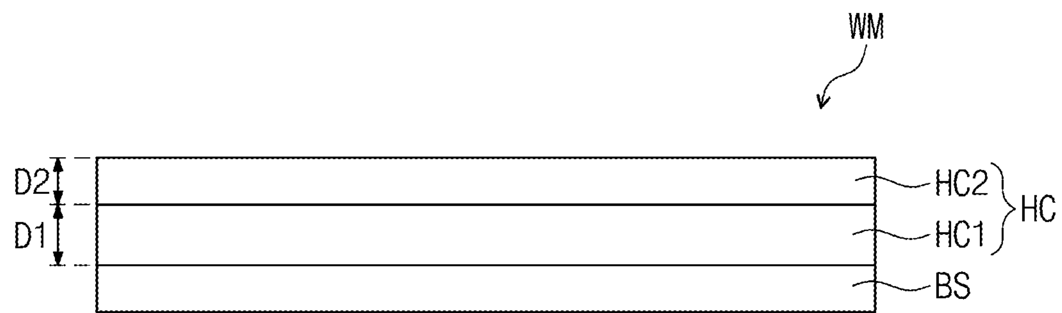
FIG. 9 illustrates a cross-sectional view showing an exemplary embodiment of a window.
Figure 10:
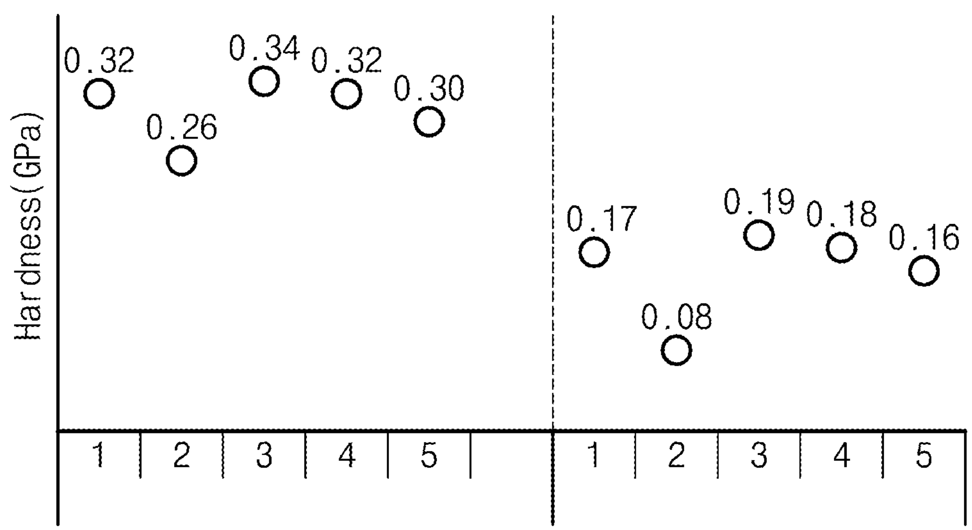
FIG. 10 illustrates a graph showing an exemplary embodiment of a hardness reduction rate of a hard coating layer.

FIG. 7 illustrates a perspective view of an exemplary embodiment of a display device DD. FIG. 8 illustrates a cross-sectional view of an exemplary embodiment of a display device DD. FIG. 9 illustrates a cross-sectional view of an exemplary embodiment of a window WM. FIG. 10 illustrates a graph showing an exemplary embodiment of a hardness reduction rate of a hard coating layer HC.

Referring to FIGS. 7 to 9, an exemplary embodiment of the display device DD according to the invention includes a display module DM and a window WM.

The display module DM may include a protective film PM, a display panel DP, an optical member PZ, and an input sensing member TS. The display panel DP, the optical member PZ, and an input sensing member TS may be sequentially laminated on the protective film PM.

Although not shown, the display device DD may further include a first adhesive member, a second adhesive member, a third adhesive member, and a fourth adhesive member. The first adhesive member may bond the display panel DP and the protective film PM to each other, the second adhesive member may bond the display panel DP and the optical member PZ to each other, the third adhesive member may bond the optical member PZ and the input sensing member TS to each other, and the fourth adhesive member may bond the input sensing member TS and the window WM to each other.

Although not shown, the display device DD may further include a frame structure that maintains the states illustrated in FIGS. 2 to 6. The frame structure may include a joint structure or a hinge structure.

The display module DM may have atop surface and a bottom surface that faces the top surface. The top surface of the display module DM may display an image. The display module DM may produce an image, which image is displayed in a direction toward the window WM in contact with the top surface of the display module DM.

The protective film PM may be disposed below the display panel DP, protecting the display panel DP. In an exemplary embodiment, the protective film PM may prevent the display panel DP from receiving external moisture and may absorb external impact, for example. The protective film PM may include a plastic film as a base layer. In an exemplary embodiment, the protective film PM may include a plastic film that includes one of polyethersulfone ("PES"), polyacrylate, polyetherimide ("PEI"), polyethylenenaphthalate ("PEN"), polyethyleneterephthalate ("PET"), polyphenylene sulfide ("PPS"), polyarylate, polyimide ("PI"), polycarbonate ("PC"), poly(arylene ethersulfone), and any combination thereof.

The material included in the protective film PM is not limited to the plastic resin, but may include an organic/inorganic composite material. The protective film PM may include a porous organic layer and an inorganic material that fills pores of the organic layer. The protective film PM may further include a film-functional layer disposed on a plastic film. The film-functional layer may include a resin layer. The film-functional layer may be provided by a coating method.

The display panel DP generates an image. The image displayed on the display module DM may be produced from the display panel DP. The image may be externally displayed through the window WM. The display panel DP may be, but not particularly limited to, one of a liquid crystal display panel, an electrophoretic display panel, a microelectromechanical system ("MEMS") display panel, an electro-wetting display panel, an organic light emitting display panel, a micro-LED display panel, a quantum-dot display panel, and a quantum-rod display panel.

Although not shown, the display panel DP may include a base substrate, a circuit layer, and a display element layer. The base substrate may provide a base surface on which the display element layer is disposed. The base substrate may be a glass substrate, a metal substrate, a plastic substrate, or the like.

In an exemplary embodiment, the circuit layer may be disposed on the base substrate. The circuit layer may include a plurality of transistors. Each of the transistors may include a control electrode, an input electrode, and an output electrode. In an exemplary embodiment, the circuit layer may include a driver transistor and a switching transistor that drive a plurality of light-emitting elements, for example.

In an exemplary embodiment, the display element layer may include a first electrode, a second electrode, an emission layer, and a plurality of organic layers. In an exemplary embodiment, the plurality of organic layers may be one or more of a hole injection layer, a hole transport layer, an electron injection layer, and an electron transport layer, for example. The invention, however, is not limited thereto. In an exemplary embodiment, the emission layer of the display element layer may include a liquid crystal layer or a quantum-dot, for example.

The input sensing member TS may detect externally applied touch to generate an electric signal. The touch includes contact/proximity of human body, contact/proximity of conductor, light, heat, pressure, or any other external inputs. The input sensing member TS may include a conductive sensor, an optical sensor, a thermal sensor, or any various sensors capable of detecting inputs. The input sensing member TS may detect a touch applied in a capacitive method or a pressure sensing method.

The optical member PZ optically converts an incident light. The optical member PZ may reduce reflectance of light incident onto a front surface, induce re-reflection of light incident onto a rear surface, or increase transmittance of light incident onto a rear surface. The optical member PZ may include one or more of a polarizing film, an anti-reflective film, a phase difference film, and an anti-scattering film.

FIG. 8 exemplarily shows that the input sensing member TS is disposed on the optical member PZ such that the optical member PZ is placed adjacent to the display panel DP. The invention, however, is not limited thereto, and an arrangement relationship between components may be changed. In an exemplary embodiment, the input sensing member TS may be disposed on the display panel DP, and the optical member PZ may be disposed on the input sensing member TS, for example. The input sensing member TS and its underlying display panel DP may be unitary with each other in a successive process. In this case, the input sensing member TS may be referred to as an input sensing layer.

The window WM may be disposed on the input sensing member TS. The window WM may protect the display module DM against external impact, and may provide users with an input sensing surface. In an exemplary embodiment, the input sensing surface may be a touch sensing surface or a fingerprint recognizing surface, for example. The invention, however, is not limited thereto.

In an exemplary embodiment of the invention, the window WM includes a base layer BS and a hard coating layer HC.

The base layer BS may include a polymer film, a plastic substrate, or a glass. In an exemplary embodiment, the base layer BS may be a polymer film, for example. In detail, the base layer BS may be a polymer film including translucent polymer resin. In an exemplary embodiment, when the base layer BS is a polymer film, the polymer film may include one or more of triacetyl cellulose, acetyl cellulose butyrate, ethylene-vinyl acetate copolymer, propionyl cellulose, butyryl cellulose, acetyl propionyl cellulose, polyester, polystyrene, polyamide, polyetherimide, polyacryl, polyimide, polyether sulfone, polysulfone, polyethylene, polypropylene, polymethylpentene, polyvinyl chloride, polyvinylidene chloride, polyvinyl alcohol, polyvinyl acetal, polyether ketone, polyether ether ketone, polyether sulfone, polymethyl methacrylate, polyethylene terephthalate, polybutylene terephthalate, polyethylene naphthalate, and polycarbonate, for example. In an exemplary embodiment, the base layer BS may include polyimide, for example. The invention, however, is not limited thereto.

The hard coating layer HC may be disposed on the base layer BS. In an exemplary embodiment, the hard coating layer HC may be in contact with the base layer BS. In an alternative exemplary embodiment, an organic or inorganic layer may be additionally provided between the hard coating layer HC and the base layer BS. The hard coating layer HC may protect the base layer BS. It may therefore be desired that the hard coating layer HC have a predetermined hardness.

The hard coating layer HC may include an antistatic agent. The antistatic agent uses a well-known material. In an exemplary embodiment, the antistatic agent may include at least one of lithium hexafluorophosphate ($LiPF_6$), lithium hexafluoroarsenate ($LiAsF_6$), lithium tetrafluoroborate ($LiBF_4$), lithium bis(trifluoromethanesulfonyl)imidate (LiTFSI), lithium bis(fluorosulfonyl)imide (LiFSI), superacid lithium salts (LiSA: $C_nF_{2n+1}SO_3Li$, n=4,8,10), lithium polyanion salts, 1,2,3-dithiazolidine-4,4,5,5-tetrafluoro-1,1,3,3-tetraoxide (LiCTFSI), 1-ethyl-3-methylimidazolium tetrafluoroborate ($C_6H_{15}BF_4N_2$), 1-butyl-3-methylimidazolium hexafluorophosphate ($C_8H_{15}F_6N_2P$), 1-butyl-3-methylimidazolium tetrafluoroborate ($C_8H_{15}BF_4N_2$), 1-butyl-3-methylimidazolium hexafluoroantimonate ($C_8H_{15}F_6N_2Sb$), 1-butyl-2,3-dimethylimidazolium tetrafluoroborate ($C_9H_{17}BF_4N_2$), 1-butyl-2,3-dimethylimidazolium trifluoromethane-sulfonate ($C_8H_{13}F_3N_2O_3S$), 1-ethyl-3-methylimidazolium trifluoromethane-sulfonate ($C_7H_{11}F_3N_2O_3S$), methyl-trioctylammonium bis(trifluoromethyl-sulfonyl)imide ($C_{27}H_{54}F_6N_2O_4S_2$), tetraethylammonium trifluoromethanesulfonate ($C_9H_{20}F_3NO_3S$), triethyl sulfonium bis(trifluoromethylsulfonyl)imide ($C_8H_{15}F_6NO_4S_2$), tetrabutylphosphonium tetrafluoroborate ($C_{16}H_{36}BF_4P$), 1-butyl-3-methylimidazolium bis(trifluoromethyl-sulfonyl)imide ($C_{10}H_{15}F_6N_3O_4S_2$), 1-butyl-3-methylpyridinium bis(trifluoromethylsulfonyl)imide ($C_{12}H_{16}F_6N_2O_4S_2$), 1,2-dimethyl-3-propylimidazolium bis(trifluoromethylsulfonyl)imide ($C_{10}H_{15}F_6N_3O_4S_2$), 1,2-dimethyl-3-propylimidazolium tris(trifluoromethyl-sulfonyl) methide ($C_{12}H_{15}F_9N_2O_6S_3$), 1-ethyl-3-methylimidazolium bis(pentafluoroethylsulfonyl)imide ($C_{10}H_{11}F_{10}N_3O_4S_2$), 1-ethyl-3-methylimidazolium bis(trifluoromethylsulfonyl) imide ($C_8H_{11}F_6N_3O_4S_2$), 1-butyl-3-methylimidazolium hexafluorophosphate ($C_8H_{15}F_6N_2P$), 1-butyl-4-methylpyridinium tetrafluoroborate ($C_{10}H_{16}BF_4N$), 1-hexyl-3-methylimidazolium tetrafluoroborate ($C_{10}H_{19}BF_4N_2$), 1-methyl-3-octylimidazolium hexafluorophosphate ($C_{12}H_{23}F_6N_2P$), and 1-methyl-3-octylimidazolium tetrafluoroborate ($C_{12}H_{23}BF_4N_2$), for example. In an exemplary embodiment, the antistatic agent may be antimony tin oxide ("ATO") as a Sb-based material, for example. The invention, however, is not limited thereto.

The translucent resin may be a photo-curable resin.

The hard coating layer HC may include a first layer HC1 and a second layer HC2. The first layer HC1 may be disposed on the base layer BS. The second layer HC2 may be disposed on the first layer HC1. In an exemplary embodiment, the hard coating layer HC may have a thickness ranging between about 5 micrometers (μm) and about 20 μm, for example. In an exemplary embodiment, the hard coating layer HC may have a thickness of about 10 μm, for example. The invention, however, is not limited thereto. In this description, the term "thickness" may indicate a height measured in a stacking direction of a target layer. The first layer HC1 may have a first thickness D1. The second layer HC2 may have a second thickness D2. In an exemplary embodiment, the first thickness D1 may be ⅔ to 9 times the second thickness D2, for example.

In an exemplary embodiment, the second layer HC2 may include an antistatic agent. In an exemplary embodiment, the antistatic agent may include a Sb-based material. In an exemplary embodiment, an atomic ratio of antimony (Sb) in the second layer HC2 may be greater than that in the first layer HC1, for example. In an exemplary embodiment, the second layer HC2 may include an antistatic agent, for example, but the first layer HC1 may include no antistatic agent.

In an exemplary embodiment, each of the hard coating layer HC and the base layer BS may have a hardness reduction rate expressed by Equation 1 below.

$$H = \left(1 - \frac{D_1}{D_2}\right) \times 100 \quad \text{[Equation 1]}$$

In Equation 1, the symbol H indicates a hardness reduction rate (%) of a target layer, the symbol $D_1$ denotes hardness of the target layer at 60° C. with a relative humidity of 93%, and the symbol $D_2$ refers to hardness of the target at a room temperature with a relative humidity of 30%. In this description, the term "humidity" means a relative humidity. In detail, each of $D_1$ and $D_2$ is hardness measured from a target layer according to the ISO 14577-1 standard using Nanoindenter available from Anton Paar GmbH.

In an exemplary embodiment, when calculating the hardness reduction rate H of the hard coating layer HC, $D_1$ indicates a hardness of the hard coating layer HC at a temperature of 60° C. with a humidity of 93%, and $D_2$ denotes a hardness of the hard coating layer HC at a room temperature with a humidity of 30%, for example.

In an exemplary embodiment, when calculating the hardness reduction rate H of the base layer BS, $D_1$ indicates a hardness of the base layer BS at a temperature of 60° C. with a humidity of 93%, and $D_2$ denotes a hardness of the base layer BS at a room temperature with a humidity of 30%, for example.

In an exemplary embodiment, the window WM includes the hard coating layer HC whose hardness reduction rate H is equal to or less than 50%. The hard coating layer HC whose hardness reduction rate H may maintain its durability even at a high temperature with a high humidity (e.g., at a temperature of 60° C. with a humidity of 94%).

Some exemplary embodiments will now be described in detail to aid in clearly explaining the invention. The following embodiments are mere examples to aid in clearly understanding the invention, and the scope of the invention is not limited thereto.

(Evaluation of Changes in a Hardness Depending on Variations in a Temperature and a Humidity)

Condition 1 is set to a room temperature with a humidity of 30%, Condition 2 is set to a temperature of 60° C. with a humidity of 30%, and Condition 3 is set to a temperature of 60° C. with a humidity of 93%. A hardness of a target layer was measured according to the ISO 14577-1 standard using Nanoindenter available from Anton Paar GmbH.

HC-1 and HC-2 relate to a hardness measured from the hard coating layer HC. BS-1 and BS-2 relate to a hardness measured from the base layer BS. The hard coating layer HC related to HC-1 includes an antistatic agent including a Sb-based material. The hard coating layer HC related to HC-2 includes an antistatic agent including a Li-based material. The base layer BS related to BS-1 or BS-2 includes a polyimide resin.

Table 1 below shows measured hardness of HC-1, HC-2, BS-1, and BS-2. Table 2 below shows a hardness reduction rate expressed by the previous Equation 1, the following Equation 2, or the following Equation 3 using hardness in Table 1.

$$H_1 = \left(1 - \frac{E_1}{D_2}\right) \times 100 \quad \text{[Equation 2]}$$

$$H_2 = \left(1 - \frac{D_1}{E_1}\right) \times 100 \quad \text{[Equation 3]}$$

In Equation 2 and Equation 3, $H_1$ and $H_2$ indicate a hardness reduction rate (%) of a target layer.

$D_1$ is a hardness measured from the target layer at a temperature of 60° C. with a humidity of 93%.

$D_2$ is a hardness measured from the target layer at a room temperature with a humidity of 30%.

$E_1$ is hardness measured from the target layer at a temperature of 60° C. with a humidity of 30%.

TABLE 1

| | Hardness (Gpa) | | |
|---|---|---|---|
| Classification | Condition 1 (Room temperature with humidity of 30%) | Condition 2 (Temperature of 60° C. with humidity of 30%) | Condition 3 (Temperature of 60° C. with humidity of 93%) |
| HC-1 | 0.32 | 0.27 | 0.17 |
| HC-2 | 0.26 | 0.20 | 0.08 |
| BS-1 | 0.54 | 0.47 | 0.38 |
| BS-2 | 0.53 | 0.48 | 0.39 |

TABLE 2

| Classification | $H_1$ | $H_2$ | H |
|---|---|---|---|
| HC-1 | 16% | 37% | 47% |
| HC-2 | 22% | 60% | 70% |
| BS-1 | 13% | 19% | 30% |
| BS-2 | 11% | 19% | 28% |

Referring to Table 2, it may be ascertained that each of hardness reduction rates $H_1$, $H_2$, and H is greater for HC-1 and HC-2 than for BS-1 and BS-2. At a condition of a high temperature and a high humidity (e.g., at a temperature of 60° C. with a humidity of 93%), for example, it may be demonstrated that the hardness reduction rate of the hard coating layer HC is greater than that of the base layer BS. At the condition of a high temperature and a high humidity (e.g., at a temperature of 60° C. with a humidity of 93%), because the hardness reduction rate of the hard coating layer HC is greater than that of the base layer BS, a repetitive folding may cause a whitening event occurring due to high stress produced in the base layer BS whose hardness reduction rate is relatively small. In addition, when the temperature increases from Condition 1 to Condition 2, it may be found that the hard coating layer HC and the base layer BS have similar hardness reduction rates $H_1$ to each other.

In contrast, when the humidity increases from Condition 2 to Condition 3, it may be found that the hard coating layer HC has a greater hardness reduction rate $H_2$ than that of the base layer BS. Accordingly, it may be ascertained that an increase in moisture content of the hard coating layer HC at the condition of a high humidity leads to a large variation in hardness, and in turn, the whitening event occurs at an upper portion of the base layer BS.

(Reference Evaluation of Hardness Reduction Rate of the Hard Coating Layer with Increased Durability)

Table 3 below shows the hardness reduction rate H obtained from Equation 1 into which are substituted hardness values of the hard coating layer HC that are measured as shown in FIG. 10. Embodiments 1 to 4 have hardness values of the hard coating layer HC that are measured at corresponding numerals 1, 3, 4, and 5 in FIG. 10. In Comparative 1, the hard coating layer HC has hardness at a numeral 2 in FIG. 10. In Embodiments 1 to 4, the whitening event does not occur in the base layer BS, but in Comparative 1, the whitening event occurs in the base layer BS.

TABLE 3

| Classification | | Embodiment 1 | Embodiment 2 | Embodiment 3 | Embodiment 4 | Comparative 1 |
|---|---|---|---|---|---|---|
| Hardness (Gpa) | Room temperature | 0.32 | 0.34 | 0.32 | 0.30 | 0.26 |
| | Temperature of 60° C. with humidity of 93% | 0.17 | 0.19 | 0.18 | 0.16 | 0.08 |
| Hardness reduction rate (H) | | 47% | 44% | 45% | 48% | 70% |

Referring to Table 3, it may be found that the hardness reduction rate H is less than 50% in Embodiments 1 to 4. The hardness reduction rate H of Comparative 1 is 70% greater than those of Embodiments 1 to 4. Accordingly, it may be concluded that because Embodiments 1 to 4 include the hard coating layer HC whose hardness reduction rate is less than 50%, there is no occurrence of the whitening event in the base layer BS. In an exemplary embodiment, a successive process may force the hard coating layer HC and the base layer BS to contact each other in the window WM. Due to stress caused by a repetitive folding of the window WM at a high temperature and a high humidity, a whitening event may occur in the vicinity of a contact interface of the base layer BS. In an exemplary embodiment, when the hard coating layer HC has a hardness reduction rate greater than 50%, for example, a hardness reduction rate difference between the hard coating layer HC and the base layer BS may become increased to induce high stress between the hard coating layer HC and the base layer BS, which may result in the occurrence of the whitening event In the window WM according to an exemplary embodiment, because the hard coating layer HC has a hardness reduction rate of 50% or less, a small difference in hardness reduction rate may be maintained between the hard coating layer HC and the base layer BS, and as a result, the whitening event may be prevented from being produced even when the repetitive folding occurs at a high temperature and a high humidity.

The following will describe an exemplary embodiment of a method of fabricating the window WM according to the invention.

Figure 11:
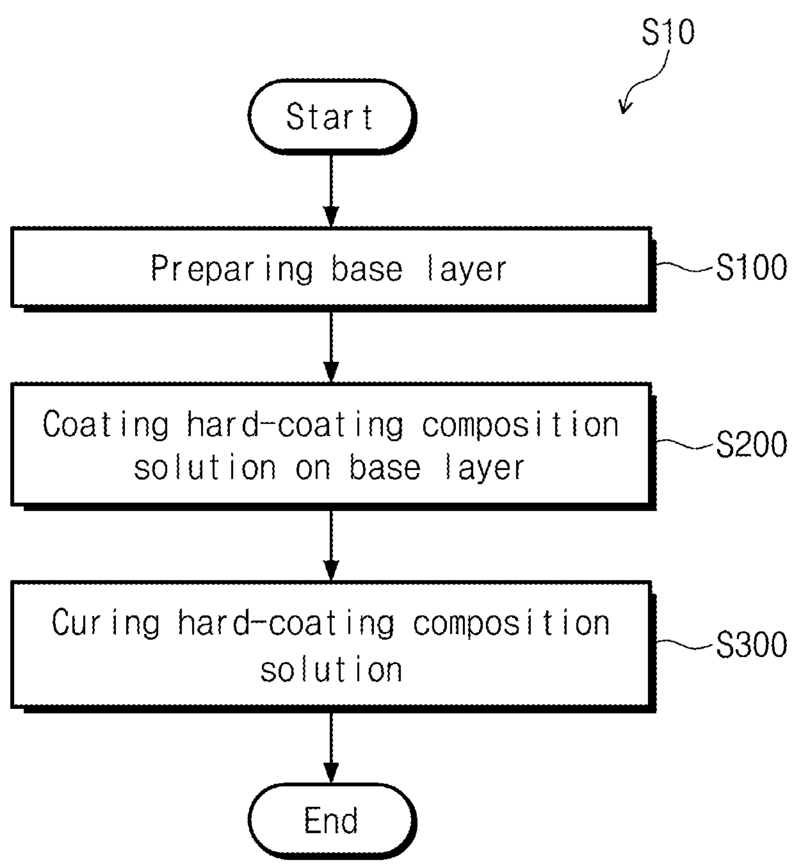
FIG. 11 illustrates a flow chart showing an exemplary embodiment of a method of fabricating a window.

FIG. 11 illustrates a flow chart S10 showing a method of fabricating the window WM. FIGS. 12A to 12C illustrate a method of fabricating the window WM.

Referring to FIG. 11, an exemplary embodiment of the method of fabricating the window WM according to the invention includes preparing a base layer BS (S100), coating a hard-coating composition solution AC on the base layer BS (S200), and curing the hard-coating composition solution AC (S300).

Referring to FIGS. 12A to 12C, the hard-coating composition solution AC may be coated on the base layer BS and then cured to form a hard coating layer HC. Referring to FIG. 12A, the hard-coating composition solution AC may be coated on the base layer BS. The hard-coating composition solution AC may include an antistatic agent, a nanosilica sol, a translucent resin, a photoinitiator, and a solvent. A description of the antistatic agent previously discussed may also be identically applicable to this exemplary embodiment.

The photoinitiator may use a well-known material. In an exemplary embodiment, the photoinitiator may include one or more of hydroxyketones, aminoketones, an intermolecular hydrogen-abstraction type photoinitiator, and any combination thereof, for example. In an exemplary embodiment, the photoinitiator may include one or more of 2-methyl-1-[4-(methylthio)phenyl]-2-morpholinyl-1-propanone, diphenylketone, benzyldimethyl ketal, 2-hydroxy-2-methyl-1-phenyl-1-one, 4"-hydroxycyclophenyl ketone, 2,2-dimethoxy-2-phenyl-acetophenone, anthraquinone, fluorene, triphenylamine, carbazole, 3-methylacetophenone, 4-chloroacetophenone, 4,4-dimethoxyacetophenone, 4,4-diaminobenzophenone, 1-hydroxycyclohexylphenylketone, benzophenone, and diphenyl(2,4,6-trimethylbenzoyl)phosphine oxide, for example.

The solvent may be used without limitations in its constitution as long as the constitution may dissolve or disperse components of the hard-coating composition solution AC. In an exemplary embodiment, the solvent may include one or more of alcohols (methanol, ethanol, isopropanol, butanol, propylene glycol methoxy alcohol, and the like), ketones (methyl ethyl ketone, methyl butyl ketone, methyl isobutyl ketone, diethyl ketone, dipropyl ketone, and the like), acetates (methyl acetate, ethyl acetate, butyl acetate, propylene glycol methoxy acetate, and the like), cellosolves (methyl cellosolve, ethyl cellosolve, propyl cellosolve, and the like), and hydrocarbons (normal hexane, normal heptane, benzene, toluene, xylene, and the like), for example.

The coating of the hard-coating composition solution AC may use well-known processes such as slit coating, knife coating, spin coating, casting, micro-gravure coating, gravure coating, bar coating, roll coating, wire bar coating, dip coating, spray coating, screen printing, gravure printing, flexographic printing, offset printing, inkjet coating, dispenser printing, nozzle coating, and capillary coating. In an exemplary embodiment, the hard coating layer HC may have a thickness ranging between about 5 μm and about 20 μm, for example. In an exemplary embodiment, the hard coating layer HC may have a thickness of about 10 μm, for example. The invention, however, is not limited thereto.

Referring to FIG. 12B, the hard-coating composition solution AC may be coated on the base layer BS to form a preliminary hard coating layer P-HC. At the step S300 of curing the hard-coating composition solution AC, the preliminary hard coating layer P-HC may be cured to form the hard coating layer HC. In an exemplary embodiment, an ultraviolet ray UV may be irradiated into the preliminary hard coating layer P-HC, thereby curing the preliminary hard coating layer P-HC, for example. The invention, however, is not limited thereto.

Referring together to FIGS. 12B and 12C, at the curing procedure, the antistatic agent included in the hard coating layer HC may be rearranged to an upper portion of the hard coating layer HC. Therefore, a distribution ratio of the antistatic agent may be greater in the second layer HC2 than in the first layer HC1. In an exemplary embodiment, the antistatic agent may be distributed to about 10% to about 60% of a thickness of the hard coating layer HC in a direction from a top surface of the hard coating layer HC toward a bottom surface of the hard coating layer HC, for example.

An exemplary embodiment of a window according to the invention may increase in durability.

An exemplary embodiment of a window fabrication method according to the invention may provide a window with increased durability.

A display device according to the invention may include a window having improved durability.

Although the exemplary embodiments have been described with reference to a number of illustrative examples thereof, it will be understood by those of ordinary skill in the art that various changes in form and details may be made without departing from the spirit and scope of the invention as set forth in the following claims.

Thus, the technical scope of the invention is not limited by the exemplary embodiments and examples described above.

The invention claimed is:

1. A window for preventing a whitening event, the window comprising:

a base layer; and a hard coating layer on the base layer, the hard coating layer including:

a first layer on the base layer, the first layer having a first thickness; and a second layer on the first layer, the second layer including an antistatic agent and having a second thickness, wherein the hard coating layer has a hardness reduction rate expressed by Equation 1 below, $$H = \left(1 - \frac{D_1}{D_2}\right) \times 100 \quad \text{[Equation 1]}$$

wherein, H is a hardness reduction rate (%) of the hard coating layer, $D_1$ is a hardness measured from the hard coating layer at a temperature of 60 degrees Celsius with a relative humidity of 93 percent, and $D_2$ is a hardness measured from the hard coating layer at a room temperature with a relative humidity of 30 percent, and the hardness reduction rate H of the hard coating layer is configurated to have a value of 50 percent or less.

2. The window of claim 1, wherein the antistatic agent includes a Sb-based material.

3. The window of claim 2, wherein an atomic ratio of Sb in the second layer is greater than an atomic ratio of Sb in the first layer.

4. The window of claim 1, wherein the first thickness is ⅔ to 9 times the second thickness.

5. The window of claim 1, wherein the hardness ($D_1$) measured from the hard coating layer at the temperature of 60 degrees Celsius with the relative humidity of 93 percent falls within a range of 0.10 gigapascal to 0.22 gigapascal, and the hardness ($D_2$) measured from the hard coating layer at the room temperature with the relative humidity of 30 percent falls within a range of 0.28 gigapascal to 0.40 gigapascal.

6. The window of claim 1, wherein the hard coating layer is in contact with the base layer.

7. The window of claim 1, wherein the base layer has a hardness reduction rate of expressed by Equation 1-1 below, $$H_b = \frac{D_{1b}}{D_{2b}} \times 100 \quad \text{[Equation 1-1]}$$

wherein, $H_b$ is a hardness reduction rate (%) of the base layer, $D_{1b}$ is a hardness measured from the base layer at a temperature of 60 degrees Celsius with a relative humidity of 93 percent, and $D_{2b}$ is a hardness measured from the base layer at a room temperature with a relative humidity of 30 percent, and the hardness reduction rate $H_b$ of the base layer is configurated to have a value of 30 percent or less.

8. The window of claim 1, wherein the hard coating layer further includes the antistatic agent, a nanosilica sol, and a translucent resin.

9. The window of claim 1, wherein the window folds with reference to a predetermined bending axis.

10. The window of claim 1, wherein the base layer includes a polymer film, a plastic substrate, or a glass.

11. The window of claim 1, wherein a thickness of the hard coating layer is in a range between 5 micrometers and 20 micrometers.

12. A method of fabricating a window for preventing a whitening event, the method comprising:

preparing a base layer;

coating a hard-coating composition solution on the base layer; and curing the hard-coating composition solution to form a hard coating layer, wherein the hard coating layer has a hardness reduction rate expressed by Equation 1 below, $$H = \left(1 - \frac{D_1}{D_2}\right) \times 100 \quad \text{[Equation 1]}$$

wherein, H is a hardness reduction rate (%) of a hard coating layer, $D_1$ is a hardness measured from the hard coating layer at a temperature of 60 degrees Celsius with a relative humidity of 93 percent, and $D_2$ is a hardness measured from the hard coating layer at a room temperature with a relative humidity of 30 percent, and the hardness reduction rate H of the hard coating layer is configurated to have a value of 50 percent or less.

13. The method of claim 12, wherein the hard-coating composition solution includes an antistatic agent, a nanosilica sol, a translucent resin, a photoinitiator, and a solvent.

14. The method of claim 13, wherein the antistatic agent is distributed to 10 percent to 60 percent of a thickness of the hard coating layer in a direction from a top surface of the hard coating layer toward a bottom surface of the hard coating layer.

15. The method of claim 12, wherein curing the hard-coating composition solution includes irradiating an ultraviolet ray into the hard-coating composition solution.

16. The method of claim 12, wherein the base layer includes a polymer film, a plastic substrate, or a glass.

17. The method of claim 12, wherein a thickness of the hard coating layer is in a range between 5 micrometers and 20 micrometers.

18. A display device for preventing a whitening event, the display device comprising:

a display module; and a window on the display module, the window including:

a base layer; and a hard coating layer on the base layer, the hard coating layer including:

a first layer on the base layer, the first layer having a first thickness; and a second layer on the first layer, the second layer including an antistatic agent and having a second thickness, wherein the hard coating layer has a hardness reduction rate expressed by Equation 1 below, $$H = \left(1 - \frac{D_1}{D_2}\right) \times 100$$ [Equation 1]

wherein, H is a hardness reduction rate (%) of the hard coating layer, $D_1$ is a hardness measured from the hard coating layer at a temperature of 60 degrees Celsius with a relative humidity of 93 percent, and $D_2$ is a hardness measured from the hard coating layer at a room temperature with a relative humidity of 30 percent, and the hardness reduction rate H of the hard coating layer is configurated to have a value of 50 percent or less.

19. The display device of claim 18, wherein the antistatic agent includes a Sb-based material.

20. The display device of claim 18, wherein the first thickness is ⅔ to 9 times the second thickness.

* * * * *